(12) United States Patent
French et al.

(10) Patent No.: US 6,987,673 B1
(45) Date of Patent: Jan. 17, 2006

(54) TECHNIQUES FOR COOLING A SET OF CIRCUIT BOARDS WITHIN A RACK MOUNT CABINET

(75) Inventors: F. William French, Littleton, MA (US); Arthur Robert Nigro, Jr., Hopkinton, MA (US)

(73) Assignee: EMC Corporation, Hopkinton, MA (US)

( * ) Notice: Subject to any disclaimer, the term of this patent is extended or adjusted under 35 U.S.C. 154(b) by 265 days.

(21) Appl. No.: 10/658,695

(22) Filed: Sep. 9, 2003

(51) Int. Cl.
*H05K 7/20* (2006.01)

(52) U.S. Cl. ............... 361/727; 361/687; 361/695; 312/223.2; 454/184

(58) Field of Classification Search ........ 361/687, 361/690, 694, 695, 697, 703, 707, 717–719, 361/720, 722, 724–727, 752, 831; 165/80.3, 165/185, 121–126; 257/713, 721; 454/184; 312/223.2, 223.3, 236, 223.21, 265.5, 365.6; 174/35 R, 35 MS, 99 R, 100, 48, 24, 69, 174/85 R, 51, 58, 52.1
See application file for complete search history.

(56) References Cited

U.S. PATENT DOCUMENTS

| | | | | |
|---|---|---|---|---|
| 4,648,007 A | * | 3/1987 | Garner ................... 361/695 |
| 5,136,464 A | * | 8/1992 | Ohmori ................... 361/694 |
| 5,237,484 A | * | 8/1993 | Ferchau et al. ......... 361/689 |
| 5,999,403 A | * | 12/1999 | Neustadt ................ 361/695 |
| 6,024,534 A | * | 2/2000 | Stevenson .............. 414/800 |
| 6,088,660 A | * | 7/2000 | Uno et al. .............. 702/130 |
| 6,157,534 A | * | 12/2000 | Gallagher et al. ...... 361/683 |
| 6,175,490 B1 | * | 1/2001 | Papa et al. ............. 361/686 |
| 6,185,098 B1 | * | 2/2001 | Benavides .............. 361/695 |
| 6,351,381 B1 | * | 2/2002 | Bilski et al. ............ 361/695 |
| 6,480,380 B1 | | 11/2002 | French et al. .......... 361/690 |
| 6,481,527 B1 | | 11/2002 | French et al. .......... 181/201 |
| 6,487,071 B1 | | 11/2002 | Tata et al. ............. 361/685 |
| 6,525,937 B2 | * | 2/2003 | Yanagida ............... 361/695 |
| 6,909,611 B2 | * | 6/2005 | Smith et al. ........... 361/727 |

* cited by examiner

*Primary Examiner*—Michael Datskovskiy
(74) *Attorney, Agent, or Firm*—BainwoodHuang; David E. Huang, Esq.

(57) ABSTRACT

A data storage subsystem is configured to mount within a rack mount cabinet. The data storage subsystem includes a housing configured to mount to a set of vertical rails of the rack mount cabinet, a set of circuit boards configured to install in a vertically aligned manner within the housing to define a set of vertically oriented channels within a central space defined by the set of vertical rails of the rack mount cabinet, and a fan assembly configured to mount to the set of vertical rails in a position above the housing to generate a vertical air stream through the set of vertically oriented channels and to exhaust the vertical air stream to an external location above the rack mount cabinet. The vertical air stream enables robust heat removal from the set of circuit boards even if the rack mount cabinet does not reside in a cold-isle environment.

15 Claims, 6 Drawing Sheets

TECHNIQUES FOR COOLING A SET OF CIRCUIT BOARDS WITHIN A RACK MOUNT CABINET

BACKGROUND OF THE INVENTION

A typical electronic equipment cabinet includes a frame and a set of panels. The frame supports electronic equipment (e.g., power supplies, backup batteries, backplanes, circuit boards, etc.). The set of panels (e.g., doors, side panels, top panels, etc.) controls access to the electronic equipment supported by the frame (e.g., protects the equipment against damage, encloses the equipment to enable fans to generate an air stream to cool the equipment, etc.).

One conventional electronic equipment cabinet (hereinafter referred to as the "conventional rack mount cabinet") includes an assembly of rigid horizontal and vertical metal beams that are fastened together to form a standard-sized frame. In particular, the metal beam assembly defines a standard width dimension for the cabinet (e.g., 19-inches) as well as defines uniformly-spaced, standard height attachment points (e.g., a standard 40-U rack) to enable vertical stacking of modularized equipment along the attachment points. Accordingly, such a cabinet enables equipment manufacturers to manufacture equipment as modularized components in common sizes (e.g., a standard-sized rack mount disk drive subsystem, a standard-sized rack mount power supply subsystem, etc.) for vertical integration with other modularized components within the rack mount cabinet.

Each modularized component typically includes, among other things, (i) a component chassis which mounts to the metal beams forming the standard-sized frame, (ii) circuitry which fastens to that component chassis, and (iii) a cooling subsystem. Users can then vertically combine modularized components from different manufacturers in a mix-and-match fashion within the rack mount cabinet to form an overall system (e.g., a data storage system, a network system, a general purpose computer system, etc.). To allow for such mixing and matching, for each modularized component, the manufacturer typically designs a separate and independent cooling subsystem to provide horizontal air flow from the front of the cabinet to the back of the cabinet through the chassis and across the circuitry of that modularized component to remove heat from that circuitry during operation.

For such a rack mount cabinet, the cooling subsystems of the rack mount modularized components work simultaneously to adequately cool the circuitry of the rack mount components when the rack mount cabinet resides adjacent an isle of cold air, i.e., a so-called "cold isle" location in which the cooling subsystems (i) draw air from an isle of cold air where system operators (e.g., technicians) typically reside and (ii) exhaust that air to an isle of higher temperature air at the back of the rack mount cabinet. The air at the back of the rack mount cabinet is warmer than that of the cold isle since it has absorbed heat as it passed horizontally through the cabinet and past the circuitry of the rack mount components in order to cool that circuitry. To facilitate such cooling, panels of the rack mount cabinet typically reside along the sides, tops and bottoms of the frame thus preventing air from escaping as it flows horizontally through the rack mount cabinet.

Another conventional electronic equipment cabinet (hereinafter referred to as the "conventional monolithic cabinet") includes a custom-built frame that defines customized dimensions at different locations rather than uniform dimensions as in the conventional rack mount cabinet. Here, a single manufacturer has control over the entire design of the cabinet and its circuits. In particular, the manufacturer has the luxury of being able to set the customized dimensions so that individual components operate together in an efficient manner. For example, the manufacturer typically includes a single cooling subsystem for cooling all of the circuits within the entire cabinet to minimize costs for cooling the equipment. In one system that uses a conventional monolithic cabinet, the cooling subsystem resides at the top of the cabinet to draw air vertically through the custom-built frame and force the air out the top of the custom-built frame.

SUMMARY

Unfortunately, there are deficiencies to the above-described conventional electronic equipment cabinets. For example, in connection with the above-described conventional rack mount cabinet that uses rack mount components with separate and individual horizontal air flow cooling subsystems, the cooling subsystems of the components are effective in "cold isle" locations, but loose their effectiveness in other locations that do not provide access to a reservoir of cold air at the front of the rack mount cabinet. In particular, even though hot air tends to rise vertically, such cooling subsystems attempt to direct air laterally in a direction that is substantially perpendicular to the vertical direction. If these cooling subsystems are unable to adequately cool the circuitry of the rack mount components, the circuitry of such components may operate improperly or in extreme cases sustain damage due to overheating. Such a deficiency will become more pronounced as circuitry evolves and higher-power integrated circuit devices (ICs) with greater cooling requirements become more common.

Additionally, in connection with the above-described conventional monolithic cabinet that uses a custom-built frame, the electronic circuits for such a cabinet are typically unsuitable for use in a standard-sized rack mount cabinet. In particular, the electronic circuits do not fit within a common-sized cabinet. Accordingly, a manufacturer of such electronic circuits is unable to sell the electronic circuits in higher volume to reduce manufacturing costs, e.g., the manufacturer cannot sell the equipment to a market which is looking to mix-and-match rack mount components vertically within a common-sized cabinet.

In contrast to the above-described conventional electronic cabinets, embodiments of the invention are directed to techniques for mounting a data storage subsystem within a rack mount cabinet where the data storage subsystem has a fan assembly configured to generate a vertical air stream through at least a portion of the rack mount cabinet and to exhaust the vertical air stream to an external location above the rack mount cabinet. Such techniques enable manufacturers of the data storage subsystem to provide effective cooling to circuitry of the data storage subsystem (e.g., adequate cooling even in non-cold isle locations) as well to broaden the market for the data storage subsystem to the rack mount cabinet market (e.g., a market in which customers are looking to mix-and-match rack mount components within common-sized cabinets).

One embodiment of the invention is directed to a data storage subsystem for mounting within a rack mount cabinet. The data storage subsystem includes a housing configured to mount to a set of vertical rails of the rack mount cabinet, a set of circuit boards configured to install in a vertically aligned manner within the housing to define a set of vertically oriented channels within a central space defined by the set of vertical rails of the rack mount cabinet, and a fan assembly configured to mount to the set of vertical rails in a position above the housing to generate a vertical air stream through the set of vertically oriented channels and to exhaust the vertical air stream to an external location above the rack mount cabinet. The vertical air stream enables reliable and robust heat removal from the set of circuit boards even if the rack mount cabinet does not reside in a cold-isle environment. Additionally, use of the rack mount cabinet to mount the housing of the data storage subsystem enables mixing-and-matching of components from different manufacturers thus broadening the market for the data storage subsystem (e.g., enabling the data storage subsystem to be vertically stacked with other components by a common-sized frame).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for mounting a data storage subsystem within a rack mount cabinet where the data storage subsystem has a fan assembly configured to generate a vertical air stream through at least a portion of the rack mount cabinet and to exhaust the vertical air stream to an external location above the rack mount cabinet. Such techniques enable an equipment manufacturer to provide effective cooling of circuitry of the data storage subsystem (e.g., adequate cooling even in non-cold isle locations) as well to broaden the market for the data storage subsystem to the rack mount cabinet market (e.g., a market in which customers are looking to mix-and-match rack mount components vertically within common-sized rack mount cabinets).

Figure 1:
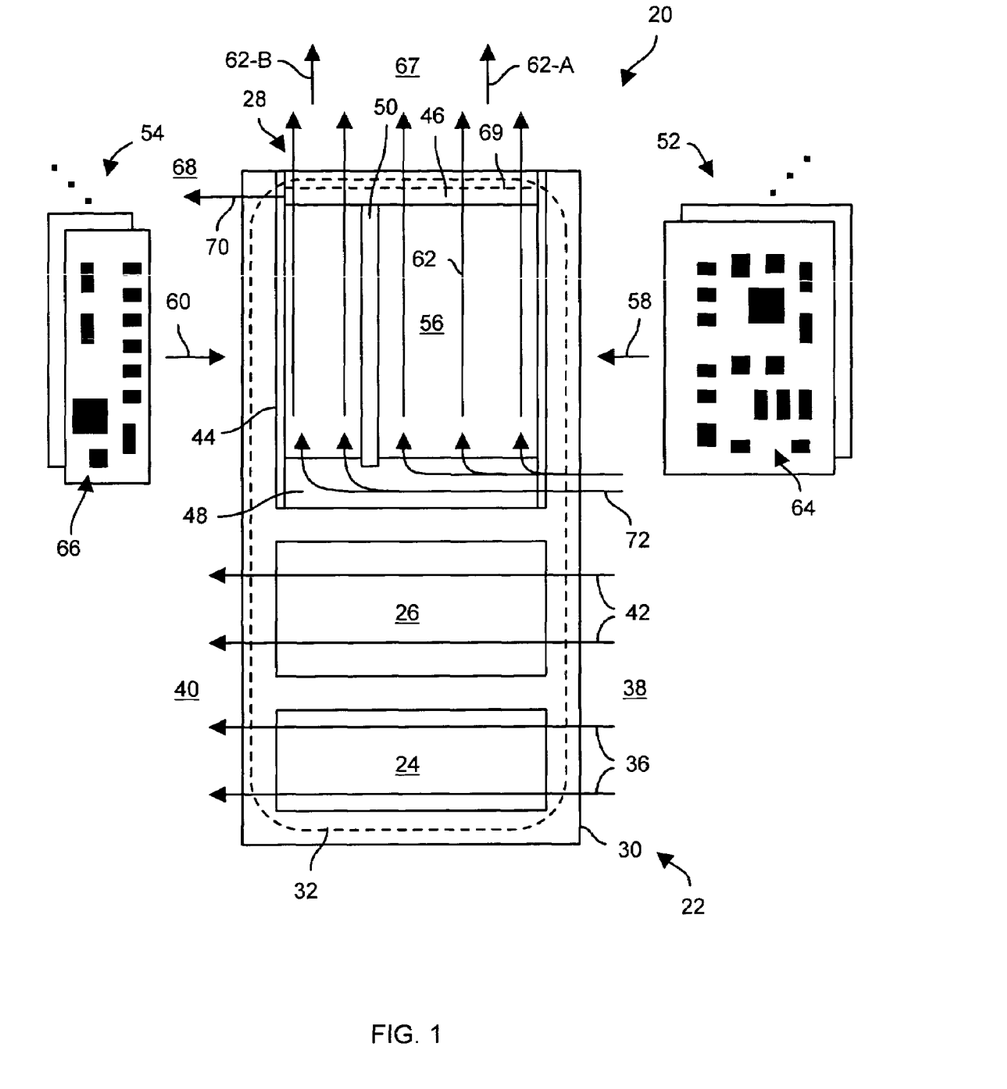
FIG. 1 is a block diagram of a rack mount data storage system which is suitable for use by the invention.

FIG. 1 shows a rack mount data storage system 20 which is suitable for use by the invention. The rack mount data storage system 20 includes a rack mount cabinet 22, a power supply subsystem 24, a disk drive subsystem 26 and a data storage circuitry subsystem 28. The rack mount cabinet 22 includes a frame 30 that defines a central space 32 within which resides the power supply subsystem 24, the disk drive subsystem 26 and the data storage circuitry subsystem 28. In particular, the power supply subsystem 24, the disk drive subsystem 26, and the data storage circuitry subsystem 28 are vertically stacked and integrated within the frame 30.

As shown in FIG. 1, the power supply subsystem 24 is configured to form a substantially horizontal air stream 36 that travels from a front 38 of the cabinet 22 to a back or rear 40 of the cabinet 22 past power supply circuitry contained therein (e.g., multiple power supplies) to cool that power supply circuitry. Similarly, the disk drive subsystem 26 is configured to form a substantially horizontal air stream 42 from the front 38 of the cabinet 22 to the back 40 of the cabinet 22 past disk drive circuitry contained therein (e.g., an array of disk drives for high capacity non-volatile data storage) to cool that disk drive circuitry. These horizontal air streams 36, 42 are well-suited for respectively removing heat from the power supply subsystem 24 and the disk drive subsystem 26 since the circuitry of such subsystems 24, 26 tends not to include temperature-critical components (e.g., high power integrated circuit devices).

As further shown in FIG. 1, the data storage circuitry subsystem 28 includes a housing 44, a fan assembly 46, a duct 48, a backplane 50, a first set of circuit boards 52 and a second set of circuit boards 54. The housing 44 is configured to mount to the rack mount cabinet 22 within a portion 56 of the central space 32 that is above the power supply subsystem 24 and also above the disk drive subsystem 26. The fan assembly 46 is disposed at the top of the housing 44, and the duct 48 is disposed at the bottom of the housing 44. The backplane 50 mounts within the housing 44 and resides in a substantially vertical orientation relative to the cabinet 22. The circuit boards 52, 54 individually insert into the housing 44 where they reside in substantially vertical orientations relative to the cabinet 22.

In one arrangement, the backplane 50 of the data storage circuitry subsystem 28 includes connectors on both sides. That is the backplane 50 is a rigid planar member having a first set of connectors on a front surface and a second set of connectors on a back surface to provide high density connections. In this arrangement, the first set of circuit boards 52 is configured to slide in a first direction 58 into the housing 44 (e.g., into slots of a card cage portion of the housing 44) and connect in a substantially perpendicular manner to the backplane 50 through the front 38 of the cabinet 22. Similarly, the second set of circuit boards 54 is configured to slide in a second direction 60 into the housing 44 and connect to the backplane through the back 40 of the cabinet 22. As shown in FIG. 1, the second direction 60 is substantially opposite the first direction 58.

It should be understood that the above-illustrated midplane/backplane 50 allows for enhanced performance and reliability. For example, the midplane/backplane 50 can be configured to provide a high-density set of relatively short-latency connections between the circuit boards 52, 54 for robust connectivity. Additionally, vertical airflow (see the arrows 62) is optimal and alleviates the need for any air holes within the backplane 50 itself. Without the vertical air stream 62, the backplane 50 would need to provide air holes for horizontal (e.g., front-to-rear) airflow thus leaving less area for signal traces and thus increasing the board pitch for such traces. However, use of the vertical air stream 62 relative to the backplane 50 and the circuit boards 52, 54 enables higher air speed (less area) and more convective cooling across the board components. Such use also forces more air onto the board surface and boundary layer of the components for better heat transfer. This allows for higher wattage/performance components to be used on the circuit boards 52, 54 (and perhaps the backplane 50 as well) and enables effective lowering of the operating temperatures for increased reliability. Furthermore, by eliminating the need for air holes, the vertical air stream 62 enables the backplane 50 to provide more signal capability and lowers the cost of the midplane/backplane 50.

In one arrangement, the front-installation circuit boards 52 are configured to perform data storage system operations on a set of disk drives of the disk drive subsystem 26 on behalf of a set of external hosts. In this arrangement, the rear-installation circuit boards 54 are configured to operate as an interface between the front-installation circuit boards 52 and the set of external hosts.

During operation, the data storage circuitry subsystem 28 receives power from the power supply subsystem 24 and accesses data within the disk drive subsystem 26 on behalf of one or more hosts (e.g., external clients). To this end, the backplane 50 and the circuit boards 52, 54 perform high speed data storage operations (e.g., write operations, read operations, data caching operations, data pre-fetching operations, etc.), and the fan assembly 46 generates an air stream 62 through the portion 56 of the central space 32 to remove heat from the circuit boards 52, 54. In particular, the fan assembly 46 draws air from the front 38 of the cabinet 22 through the housing 44 to cool circuitry 64, 66 (e.g., high speed ICs) of the circuit boards 52, 54. As mentioned earlier, the backplane 50 divides the portion 56 of the central space into two portions, i.e., two passageways or airways for air flow. Accordingly, as the air enters the intake duct 48, a portion 62-A of the air stream 62 passes in front of the backplane 50 to cool the circuit boards 52 and a separate portion 62-B of the air stream 62-B passes in back of the backplane 50 to cool the circuit boards 54.

The location of the fan assembly 46 at the top of the cabinet 22 reduces the sound level to the user and enables easy removal without having to remove other components (e.g., cables, etc.) for access. In one arrangement, when the cabinet 22 has a sufficient opening at the top, the fan assembly 46 exhausts the air of the air stream 62 to a location 67 above the cabinet 22. In an alternative arrangement, when the cabinet 22 does not have a sufficient opening at the top, the fan assembly 46 exhausts the air of the air stream 62 out the back 40 of the cabinet 22 at a location 68 which is substantially higher than the bottom of the housing 44 (e.g., two to three feet higher than the bottom of the housing 44, at a location adjacent the top of the cabinet 22, etc.). In this alternative arrangement, an optional/removable deflector plate 69 (shown as a dashed line 69 at the top of the fan assembly 46) steers the vertical air stream 62 back to the horizontal direction (see arrow 70) so that it exhausts into the location 68.

For either arrangement, the duct 48 deflects air of the air stream 62 from a substantially horizontal flow (see arrows 72) to a substantially vertical flow (see arrows 62) through the portion 56 of the central space 32 to robustly carry heat away from the circuitry 64, 66 of the circuit boards 52, 54. Accordingly, both of these arrangements are very well-suited for temperature-critical circuitry (e.g., high-speed and hotter-running integrated circuits, higher density circuits, circuitry that must run in a narrower temperature margin, etc.) even if the cabinet 22 does not reside in a cold isle location. That is, the vertically oriented air stream 62 leverages of the tendency for heat to rise thus more effectively drawing heat away from such circuitry (e.g., high-speed processors and application specific integrated circuit devices) and maintaining a stable operating environment for such circuitry. Furthermore, the vertically oriented air stream 62 alleviates the need to provide holes within the backplane 50 for horizontal airflow. Such operation is superior to the earlier-described conventional modularized rack mount components in which horizontal air streams attempt to move heated air transversely and struggle, and perhaps fail to adequately cool high power circuits when such components do not reside in a cold isle location.

It should be understood that the circuits of the power supply subsystem 24 and the data storage subsystem 26 are not as temperature-sensitive as the circuitry 64, 66 of the circuit boards 52, 54. Accordingly, during operation, the circuitry of the power supply subsystem 24 (i.e., a set of power supplies, a fan subassembly, etc.) is adequately cooled by the substantially horizontal air stream 36 passing therethrough. In particular, the air stream 36 sufficiently removes heat from the power supply subsystem 24 even if the cabinet 22 does not reside in a cold isle location since that circuitry is not very temperature-sensitive vis-à-vis high power, hot-running IC circuit board devices. Similarly, the circuitry of the data storage circuitry subsystem 26 is adequately cooled by the substantially horizontal air stream 42 passing therethrough even if the cabinet 22 does not reside in a cold isle location. Further details of the invention will now be provided with reference to FIG. 2.

Figure 2:
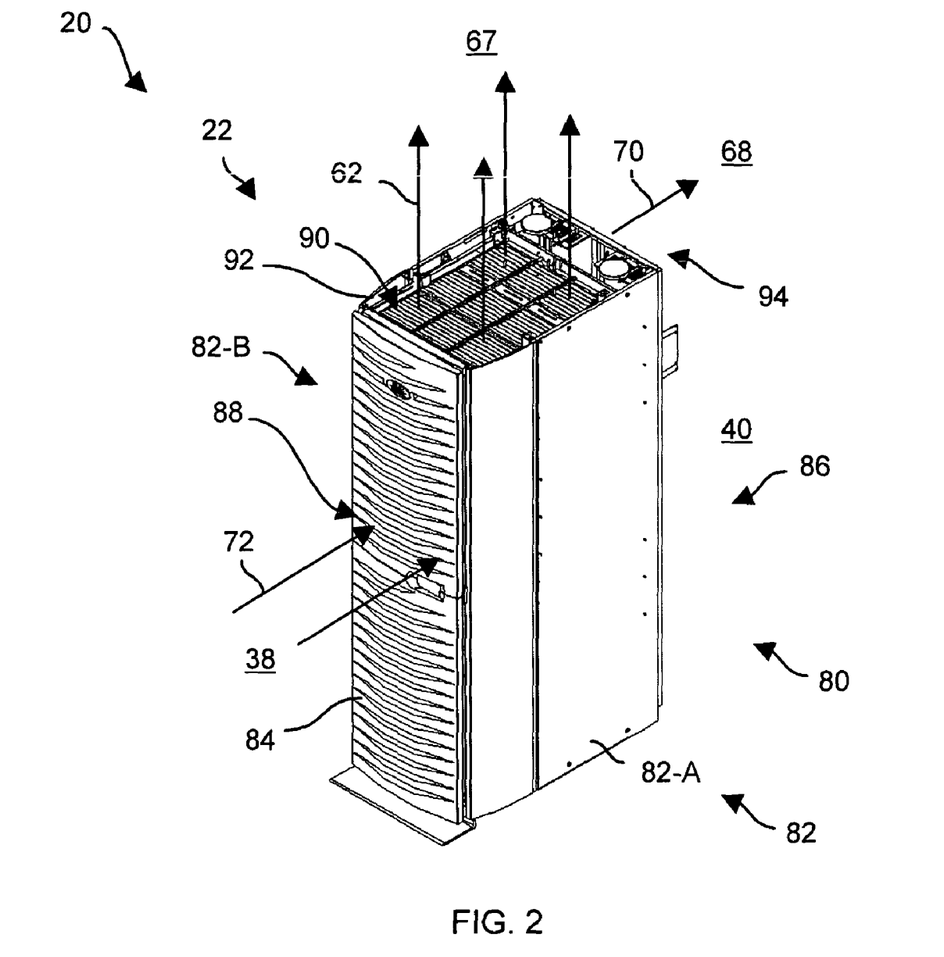
FIG. 2 is a perspective view of a rack mount cabinet of the rack mount data storage system of FIG. 1.

FIG. 2 shows a perspective view of the cabinet 22 of the rack mount data storage system 20. As shown in FIG. 2, the rack mount data storage system 20 further includes panels 80 which control access to the various operating components of the rack mount data storage system 20. The panels 80 includes a pair of side panels 82-A, 82-B (collectively, side panels 82), a set of front panels 84 (e.g., a set of front doors) disposed at the front 38 of the cabinet 22, and a set of rear panels 86 (e.g., a set of rear doors, generally depicted by the arrow 86) disposed at the rear 40 of the cabinet 22. The panels 80 attach to the frame 30 of the cabinet 22, and operate to control access to the central space 32 (also see FIG. 1). In particular, the panels 80 protect equipment housed within the central space 32 of the rack mount cabinet 22 against damage, and enclose that equipment to enable fans to generate air flow to cool the equipment.

As shown in FIG. 2, the set of front panels 84 defines apertures 88 that permit air to enter the central space 32. In particular, the air flows in a substantially horizontal direction (see the arrow 72) to remove heat from the various vertically stacked components of the rack mount data storage system 20. As explained earlier, the power supply subsystem 24 and the disk drive subsystem 26 undergo cooling via substantially horizontal air flows. In contrast, the data storage circuitry subsystem 28 undergoes cooling by way of a substantially vertical air stream 62. To this end, as air enters the duct 48 of the data storage circuitry subsystem 28 (also see FIG. 1), the walls of the duct 48, in combination with surfaces defined by other elements (e.g., the backplane 50, the circuit boards 52, 54, etc.), deflects the air from the lateral direction into a substantially vertical direction (see the arrows 62) for more effective cooling.

In one arrangement, the air of the air stream 62 exits vertically through an opening 90 at the top of the cabinet 22 thus exhausting into a location 48 over the cabinet 22. In an alternative arrangement, the air of the air stream 62 exits horizontally (e.g., see the arrow 70) to a location 68 at the back of the cabinet 22 which is substantially higher than the apertures 88 through which the air entered (e.g., the air exits out at a location that is two or three feet higher than the height in which is entered). Further details of the invention will now be provided with reference to FIG. 3.

Figure 3:
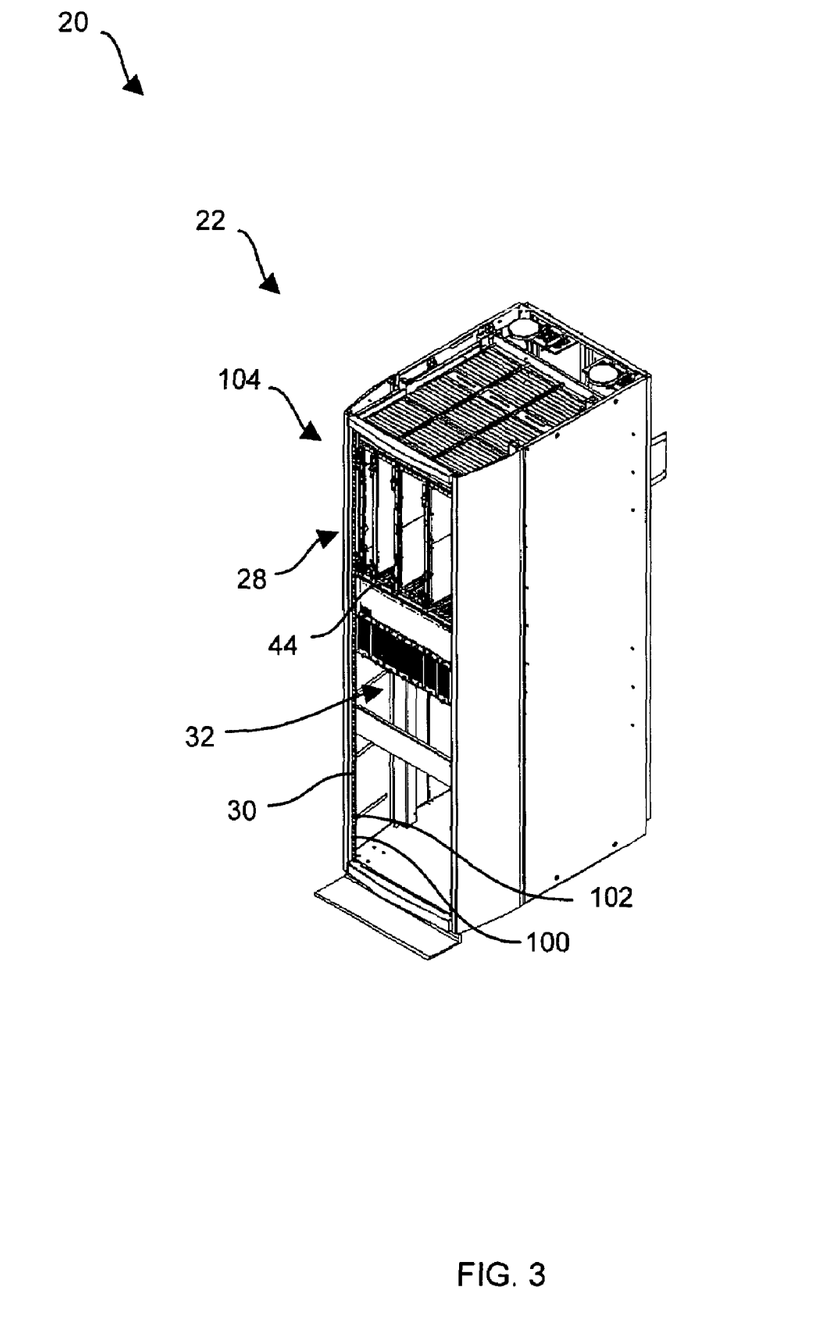
FIG. 3 is a perspective view of the rack mount cabinet of the rack mount data storage system when a set of front panels of the cabinet is removed.

FIG. 3 is a perspective view of the rack mount data storage subsystem 20 with the set of front panels 84 (FIG. 2) removed to illustrate various components within the rack mount cabinet 22. In particular, FIG. 3 shows the frame 30 of the cabinet 22, and the data storage circuitry subsystem 28 mounted to the frame 30. The frame 30 includes a set of vertical rails 100 defining the central space 32 (e.g., a vertical rail 100 in each corner of the cabinet 22 to define the central space 32 therebetween). The set of vertical rails 100 defines mounting holes 102 that enable the power supply subsystem 24 (not shown in FIG. 3 but shown in FIG. 1), the disk drive subsystem 26 (not shown in FIG. 3 but shown in FIG. 1) and the data storage circuitry subsystem 28 to mount at standard intervals in a vertically integrated fashion (e.g., the mounting holes 102 of each vertical rail 100 defines holes at standard U-intervals).

As shown in FIG. 3, the housing 44 of the data storage circuitry subsystem 28 mounts to a top portion 104 of the set of vertical rails 100. Accordingly, when the power supply subsystem 24, the disk drive subsystem 26 and the data storage circuitry subsystem 28 are vertically stacked within the cabinet 22, the data storage circuitry subsystem 28 is above the other component subsystems 24, 26 (also see FIG. 1). As a result, the fan assembly 46 of the data storage circuitry subsystem 28 is capable of exhausting the vertical air stream 62 to an elevated area above the cabinet 22 (e.g., see the locations 48, 68 in FIGS. 1 and 2). Further details of the invention will now be provided with reference to FIG. 4.

Figure 4:
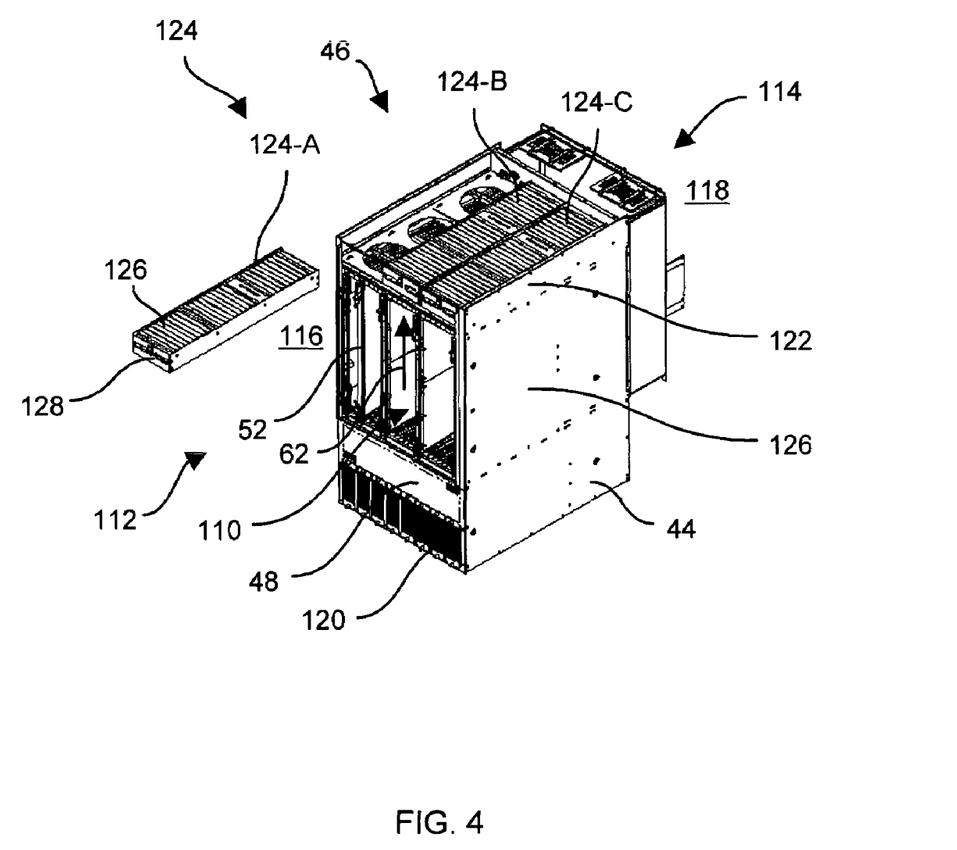
FIG. 4 is a perspective view of a housing of the rack mount data storage subsystem of FIG. 1.

FIG. 4 shows a perspective view of the data storage circuitry subsystem 28 which is configured to mount to the rack mount frame 30 of the cabinet 22. As shown, the data storage circuitry subsystem 28 is essentially a self-contained unit that can be added to a standard rack mount cabinet, e.g., stacked and integrated within a generic or standard NEMA (National Engineers and Mechanics Association) rack. In one arrangement, when the data storage circuitry subsystem 28 is installed within the rack mount cabinet (e.g., see the portion 56 of the central space 32 of FIGS. 1 and 2), the housing 44 enables an air stream 62 to exhaust out the top (see FIG. 4). In another arrangement, the housing 44 enables an air stream 62 to exhaust out the upper rear 68 of the housing 44, e.g., using the optional deflector plate 69 (see FIG. 1).

As shown in FIG. 4, the circuit boards 52, 54 insert horizontally within the housing 44. Once the circuit boards 52, 54 are installed, they reside in a vertically aligned manner to enable airflow in the vertical direction (see the arrow 62 in FIG. 4). That is, when the circuit boards 52, 54 are connected to the backplane 50, the circuit boards 52, 54 define a set of vertically oriented channels 110. In particular, the circuit boards 52 are vertically aligned and substantially parallel to each other, and also are substantially perpendicular to the backplane 50 to form the channels 110. Similarly (although not shown in FIG. 4), the circuit boards 54 are substantially parallel to each other and are substantially perpendicular to the backplane 50 to form more channels 110. In one arrangement, doors 112, 114 (shown generally as arrows 112, 114 for simplicity) are installed at the front 116 and at the rear 118 of the housing 44 to cover the channels 110 and thus prevent air of the air stream 62 from escaping as the air passes over the circuit boards 52, 54. Accordingly, there is little or no leakage and the vertical air stream 62 reliably and robustly removes heat from the circuitry 64, 66 (FIG. 1) of the circuit boards 52, 54.

As shown in FIG. 4, the duct 48 operates as an intake or plenum for air. By way of example only, the housing 44 further defines slots 120 to carry a set of disk drive assemblies. The slots 120 reside below the intake duct 48 so that the disk drive assemblies do not substantially interfere with air flow at the front 116 of the housing 44 into the vertically oriented channels 110.

As further shown in FIG. 4, the fan assembly 46 of the data storage circuitry subsystem 28 includes a carrier portion (or simply carrier) 122 and a set of fan subassemblies 124-A, 124-B, 124-C (collectively, fan subassemblies 124). The carrier 122 is essentially an extension of a card cage portion 126 of the housing 44. As explained earlier in connection with FIG. 3, the housing 44 mounts to top portions 104 of the set of vertical rails 100 of the rack mount cabinet 22. Accordingly, each fan subassembly 124 directs the air stream 62 in a direction 62 that is substantially parallel to the set of vertical rails 100 and into an external location above the rack mount cabinet (also see locations 48 and 68 in FIGS. 1 and 2).

Furthermore, as shown in FIG. 4, each fan subassembly 124 includes multiple fans 126 disposed in a row. Accordingly, when all of the fan subassemblies 124 install within the carrier 22, the fans 126 reside in an N×M array (e.g., a 3-by-3 array of fans 126). N equals the number of fan assemblies 124 in the carrier (e.g., three), and M equals the number of fans 126 within each fan assembly 124 (e.g., three). It should be understood that other numbers for N and M are suitable for use by the invention. In one arrangement, the number M of fans 126 in each fan subassembly 124 is greater than two, and the number N of fan subassemblies 124 is greater than two, as well.

It should be understood that each fan subassembly 124 is configured to operate independently of the other fan subassemblies 124 to enable hot swapping of an individual fan subassembly 124 while other fans subassemblies 124 remain in operation in response to the set of power supply signals from the power supply subsystem 24. Additionally, it should be understood that each fan subassembly 124 further includes a status indicator 128 (e.g., a set of LEDs) to selectively indicate proper operation and improper operation of the multiple fans 126 of that fan subassembly 124. Accordingly, if a fan 126 of a fan subassembly 124 were to fail, a technician can easily detect that failure by examining the status indicator 128 of that fan subassembly 124 and hot swap that fan subassembly 124 with a new fan subassembly 124 having new fans 126. Further details of the invention will now be provided with reference to FIG. 5.

Figure 5:
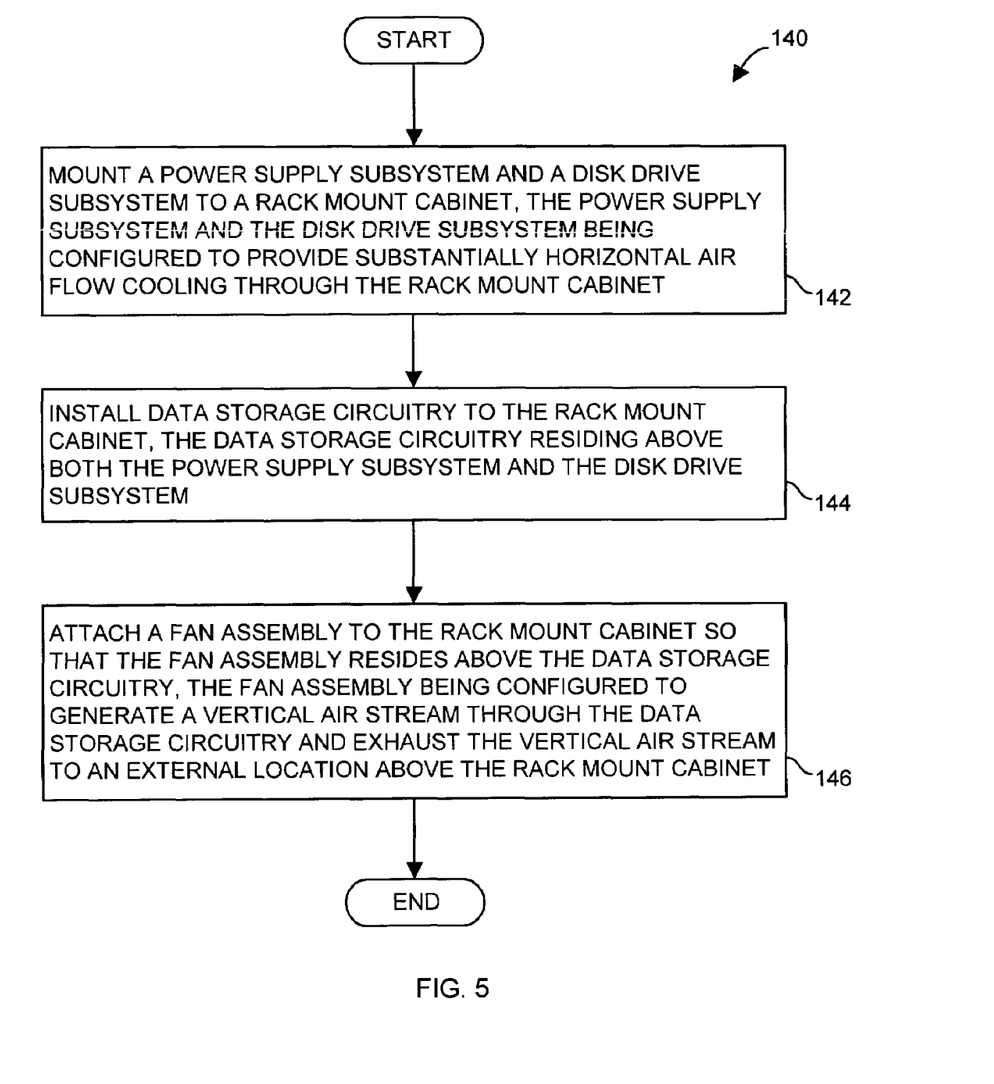
FIG. 5 is a flowchart of a procedure which is performed by a manufacturer when making the rack mount data storage system of FIG. 1.

FIG. 5 is a flowchart of a procedure 140 which is performed by a manufacturer when making the rack mount data storage system 20. In step 142, the manufacturer mounts the power supply subsystem 24 and the disk drive subsystem 26 to the rack mount cabinet 22. In particular, the manufacturer attaches the subsystems 24, 26 to the frame 30 in a vertically stacked manner. Once the subsystems 24, 26 have been properly installed, both the power supply subsystem 24 and the disk drive subsystem 26 provide substantially horizontal air flow cooling through the cabinet 22.

In step 144, the manufacturer installs the data storage circuitry subsystem 28 to the rack mount cabinet 22. In particular, the manufacturer mounts the data storage circuitry subsystem 28 so that it resides above both the power supply subsystem 24 and the disk drive subsystem 26.

In step 146, the manufacturer attaches the fan assembly 46 to the rack mount cabinet. The fan assembly 46 resides above the data storage circuitry 64, 66 of the data storage circuitry subsystem 28. Accordingly, the fan assembly 46 is capable of generating a vertical air stream 62 through the data storage circuitry 64, 66 (i.e., past the circuit boards 52, 54) and exhausting the vertical air stream 62 to an external location above the rack mount cabinet 22 (see locations 48, 68 in FIGS. 1 and 2).

It should be understood that the manufacturer is capable of performing steps 142, 144, 146 in other orders as well. For example, the manufacturer can install the data storage circuitry 64, 66 prior to installing the power supply subsystem 24 and the disk drive subsystem 26.

As mentioned above, embodiments of the invention are directed to techniques for mounting a data storage circuitry subsystem 28 within a rack mount cabinet 22 where the data storage circuitry subsystem 28 has a fan assembly 46 configured to generate a vertical air stream 62 through at least a portion of the rack mount cabinet 22 and to exhaust the vertical air stream 62 to an external location above the rack mount cabinet 22. Such techniques enable an equipment manufacturer to provide effective cooling of circuitry of the data storage circuitry subsystem 28 (e.g., adequate cooling even in non-cold isle locations) as well to broaden the market for the data storage circuitry subsystem 28 to the rack mount cabinet market (e.g., a market in which customers are looking to mix-and-match rack mount components vertically within common-sized cabinets).

While this invention has been particularly shown and described with references to preferred embodiments thereof, it will be understood by those skilled in the art that various changes in form and details may be made therein without departing from the spirit and scope of the invention as defined by the appended claims.

Figure 6:
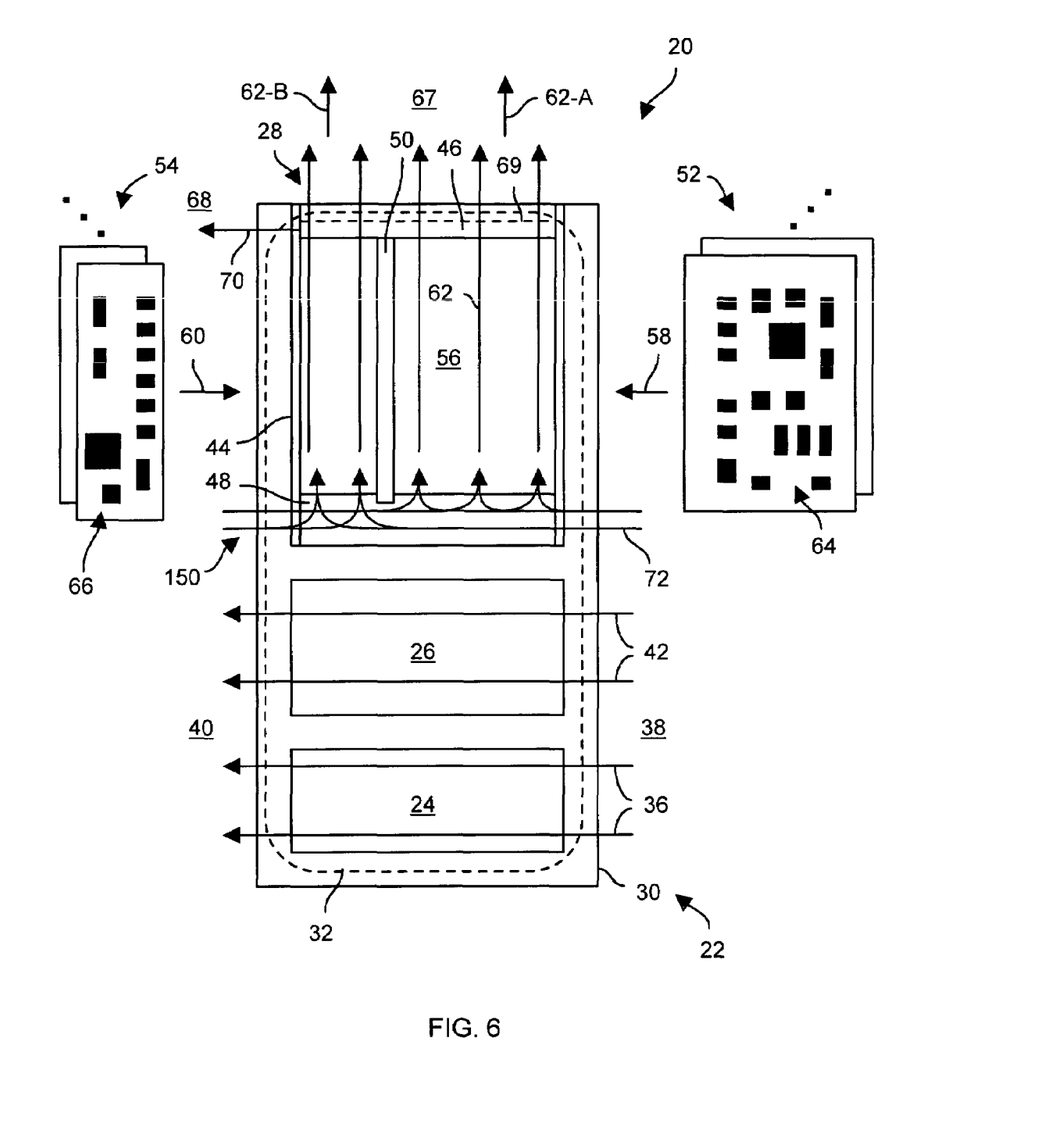
FIG. 6 is a block diagram of a rack mount data storage system having an alternative air intake configuration which is suitable for use by the invention.

For example, FIG. 6 shows an arrangement for the invention which is similar to that of FIG. 1. However, in the arrangement of FIG. 6, the duct 48 intakes air from both the front 38 and the back 40 of the cabinet 22. Since the power supply subsystem 24 and the data storage subsystem 26 exhaust air to the back 40 of the cabinet 22, air 150 at the back 40 of the cabinet 22 is higher in temperature than that at the front 38 of the cabinet 22. Nevertheless, the arrangement of FIG. 6 is well-suited for certain situations. In particular, intaking of the pre-heated air 150 into the duct 48 can provide less impedance and higher airflow. This lower impedance and higher airflow can provide more effective cooling of the circuitry 64, 66 than a lower airflow even if the lower airflow is at a somewhat lower temperature.

Additionally, it should be understood that the circuitry 64, 66 can have different cooling requirements. In one arrangement, the circuitry 66 of the circuit boards 54 includes adapter circuits for communicating with external hosts, and the circuitry 64 of the circuit boards 52 includes higher wattage control circuits (e.g., front-end and back-end director circuitry for a Symmetrix system by EMC Corporation of Hopkinton, Mass.) for performing data storage operations. In this arrangement, the fans 126 (also see FIG. 4) within the fan assembly 46 are justified to the front 38 of the cabinet 22. Accordingly, the fan assembly 46 provides higher airflow across the circuit boards 52 (also see the arrow 62-A in FIG. 1) than across the circuit boards 54 (see the arrow 62-B in FIG. 1) since the circuit boards 52 generate more heat and require more effective cooling. In the arrangement where each fan subassembly 124 includes three fans 126 (see FIG. 4), the rear fan 126 substantially contributes to providing the airflow 62-B at the rear of the cabinet 22, and the front two fans 126 substantially contribute to providing the airflow 62-A at the front of the cabinet 22 for higher velocity airflow at the front of the cabinet 22.

Furthermore, it should be understood that the data storage circuitry subsystem 28 was described above as having a fan assembly 46 that is separate and independent of fans for the power supply subsystem 24 and the data storage subsystem 26 by way of example only. In other arrangements, the data storage circuitry subsystem 28 shares the fan assembly 46 with the other subsystems 24, 26. In particular, the vertically oriented air stream 62 generated by the fan assembly 46 flows through each subsystem 24, 26, 28 and eventually exhausts to a location near the top of the cabinet 22. This alleviates the need for the other subsystems 24, 26 to have separate and independent fans and enables the other subsystems 24, 26 to leverage off of a single fan assembly 46 to reduce costs as well as to provide effective cooling in the vertical direction within the rack mount cabinet 22.

Additionally, it should be understood that the fan assembly 46 was described above as being higher than the circuit boards 52, 54 to draw or pull air past the circuit boards 52, 54. In other arrangements, the fan assembly 46 is underneath the circuit boards 52, 54 and thus pushes air past the circuit boards 52, 54.

Furthermore, it should be understood that the data storage circuitry subsystem 28 was described above as forming part of a rack mount data storage system 20 by way of example only. In other arrangements, the data storage circuitry subsystem 28 forms part of a different system such as a network system, a general purpose computer system, specialized equipment, etc. Moreover, the rack mount cooling techniques can be applied to other types of circuitry other than data storage circuitry (e.g., display equipment, networking equipment, mechanical equipment, fiber optic equipment, laser equipment, general purpose computer equipment, analog electronics, and the like), and such techniques are intended to belong to various embodiments of the invention.

What is claimed is:

1. A rack mount data storage system, comprising:
 a rack mount cabinet having a set of vertical rails defining a central space;
 a power supply subsystem mounted to the set of vertical rails of the rack mount cabinet and being disposed within the central space, the power supply subsystem having a set of power supplies configured to provide a set of power supply signals and a power supply cooling assembly configured to provide air flow substantially horizontally from a front of the rack mount cabinet to a back of the rack mount cabinet to remove heat from the set of power supplies;
 a disk drive subsystem mounted to the set of vertical rails of the rack mount cabinet and being disposed within the central space, the disk drive subsystem having a set of disk drives configured to provide high capacity non-volatile data storage in response to the set of power supply signals and a disk drive cooling assembly configured to provide air flow substantially horizontally from the front of the rack mount cabinet to the back of the rack mount cabinet to remove heat from the set of the disk drives; and
 a data storage circuitry subsystem configured to operate the disk drive subsystem in response to the set of power supply signals, the data storage circuitry subsystem including:
  a housing configured to mount to the set of vertical rails of the rack mount cabinet within the central space and above both the power supply subsystem and the disk drive subsystem;
  a set of circuit boards configured to install in a vertically aligned manner within the housing to define a set of vertically oriented channels within the central space defined by the set of vertical rails of the rack mount cabinet; and a fan assembly configured to mount to the set of vertical rails in a position above the housing to generate a vertical air stream through the set of vertically oriented channels and to exhaust the vertical air stream to an external location above the rack mount cabinet.

2. The rack mount data storage system of claim 1, further comprising:
an intake duct configured to attach to the set of vertical rails in a position (i) above both the power supply subsystem and the disk drive subsystem and (ii) beneath the housing to deflect incoming air into the set of vertically oriented channels within the central space.

3. The rack mount data storage system of claim 2 wherein the housing includes a card cage configured to hold the circuit boards in a substantially parallel manner, and wherein the data storage subsystem further comprises:
a backplane disposed within the card cage in a substantially perpendicular manner to the set of circuit boards to provide a set of high density connections to the set of circuit boards.

4. The rack mount data storage system of claim 3 wherein the set of circuit boards includes a set of front-installation circuit boards which is configured to insert into the card cage through a front of the rack mount cabinet, and a set of rear-installation circuit boards which is configured to insert into the card cage through a rear of the rack mount cabinet; and wherein the backplane includes:
a rigid planar member having a front side that faces toward the front of the rack mount cabinet and a rear side that faces toward the rear of the rack mount cabinet,
a set of front backplane connectors disposed on the front side of the rigid planar member to connect with the set of front-installation circuit boards, and
a set of rear backplane connectors disposed on the rear side of the rigid planar member to connect with the set of rear-installation circuit boards.

5. The rack mount data storage system of claim 4 wherein the set of front-installation circuit boards is configured to perform data storage system operations on the set of disk drives on behalf of a set of external hosts, wherein the set of rear-installation circuit boards is configured to operate as an interface between the set of front-installation circuit boards and the set of external hosts, and wherein the data storage subsystem further comprises:
a front door configured to reside adjacent the housing at the front of the rack mount cabinet to operatively control user access to the set of front-installation circuit boards when the set of front-installation circuit boards is inserted into the card cage, and
a rear door configured to reside adjacent the housing at the rear of the rack mount cabinet to operatively control user access to the set of rear-installation circuit boards when the set of rear-installation circuit boards is inserted into the card cage, the front and rear doors being configured to (i) prevent air of the vertical air stream from substantially escaping through the front and rear of the rack mount cabinet and (ii) deflect air of the vertical air stream from the intake duct to the fan through the set of vertically oriented channels defined by the set of circuit boards.

6. The rack mount data storage system of claim 5 wherein the rigid planar member of the backplane is configured to divide the set of vertically oriented channels into a set of front airways proximate to the front of the rack mount cabinet to carry a first portion of the vertical air stream and a set of rear airways proximate to the rear of the rack mount cabinet to carry a second portion of the vertical air stream.

7. The rack mount data storage system of claim 5 wherein the fan assembly is configured to provide, as the first portion of the vertical air stream, a first airflow through the set of front airways and a second airflow, as the second portion of the vertical air stream, through the set of rear airways; and wherein the first airflow has a higher velocity than the second airflow.

8. The rack mount data storage system of claim 2 wherein the rack mount cabinet is configured to reside between a rear hot isle at the rear of the rack mount cabinet and a front cold isle at the front of the rack mount cabinet, and wherein the intake duct defines sides that prevent air intake from the rear hot isle and an opening that permits air intake from the front cold isle.

9. The rack mount data storage system of claim 2 wherein the intake duct is configured to substantially intake air for the vertical air stream from both the front of the rack mount cabinet and the back of the rack mount cabinet.

10. The rack mount data storage system of claim 1 wherein the fan assembly includes:
a carrier configured to mount to a set of top portions of the set of vertical rails of the rack mount cabinet; and
a set of fan subassemblies supported by the carrier, the set of fan subassemblies being configured to exhaust the vertical air stream in a direction that is substantially parallel to the set of vertical rails and into the external location above the rack mount cabinet.

11. The rack mount data storage system of claim 10 wherein the set of fan subassemblies include:
multiple fans disposed in a row, each fan subassembly being configured to insert into the carrier in a horizontal direction that is substantially perpendicular to the vertical air stream.

12. The rack mount data storage system of claim 11 wherein the multiple fans define a horizontal M×N array of fans where M is greater or equal to 2 and N is greater or equal to 2, where M is the number of fans in each fan subassembly, and wherein N is the number of fan subassemblies in the set of fan subassemblies.

13. The rack mount data storage system of claim 11 wherein each fan subassembly is configured to operate independently of the other fan subassemblies to enable hot swapping of an individual fan while other fans remain in operation in response to the set of power supply signals.

14. The rack mount data storage system of claim 13 wherein each fan subassembly further includes:
a status indicator to selectively indicate proper operation and improper operation of the multiple fans of that fan subassembly.

15. A method for making a rack mount data storage system, the method comprising:
mounting a power supply subsystem and a disk drive subsystem to a rack mount cabinet, both the power supply subsystem and the disk drive subsystem being configured to provide substantially horizontal air flow cooling therethrough;
installing data storage circuitry to the rack mount cabinet, the data storage circuitry residing above both the power supply subsystem and the disk drive subsystem; and
attaching a fan assembly to the rack mount cabinet, the fan assembly residing above the data storage circuitry, the fan being configured to generate a vertical air stream through the data storage circuitry and exhaust the vertical air stream to an external location above the rack mount cabinet.

* * * * *